(12) United States Patent
Sinha et al.

(10) Patent No.: US 7,118,686 B2
(45) Date of Patent: *Oct. 10, 2006

(54) SLURRY FOR USE IN POLISHING SEMICONDUCTOR DEVICE CONDUCTIVE STRUCTURES THAT INCLUDE COPPER AND TUNGSTEN AND POLISHING METHODS

(75) Inventors: Nishant Sinha, Boise, ID (US); Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/326,651

(22) Filed: Dec. 19, 2002

(65) Prior Publication Data

US 2003/0087525 A1    May 8, 2003

Related U.S. Application Data

(63) Continuation of application No. 09/653,392, filed on Aug. 31, 2000, now Pat. No. 6,551,935.

(51) Int. Cl.
*C09K 13/00* (2006.01)
(52) U.S. Cl. ..................... 252/79.1; 252/79.4
(58) Field of Classification Search .......... 252/79.1, 252/79.2, 79.4; 438/690, 692, 694
See application file for complete search history.

(56) References Cited

U.S. PATENT DOCUMENTS

| | | | |
|---|---|---|---|
| 5,244,534 A | 9/1993 | Yu et al. | 156/636 |
| 5,300,155 A | 4/1994 | Sandhu et al. | 148/33 |
| 5,451,551 A | 9/1995 | Krishnan et al. | 216/89 |
| 5,575,885 A | 11/1996 | Hirabayashi et al. | 156/626.1 |
| 5,618,381 A | 4/1997 | Doan et al. | 438/633 |
| 5,676,587 A | 10/1997 | Landers et al. | 451/57 |
| 5,681,423 A | 10/1997 | Sandhu et al. | 156/636.1 |
| 5,780,358 A | 7/1998 | Zhou et al. | 438/645 |
| 5,804,513 A | 9/1998 | Sakatani et al. | 216/89 |
| 5,840,629 A | 11/1998 | Carpio | 438/692 |
| 5,846,398 A | 12/1998 | Carpio | 205/775 |
| 5,863,307 A | 1/1999 | Zhou et al. | 51/307 |
| 5,897,375 A | 4/1999 | Watts et al. | 438/693 |
| 5,934,980 A | 8/1999 | Koos et al. | 451/41 |
| 5,954,975 A | 9/1999 | Cadien et al. | 216/38 |
| 5,954,997 A | 9/1999 | Kaufman et al. | 252/79.1 |
| 5,972,792 A | 10/1999 | Hudson | 438/691 |
| 6,001,730 A | 12/1999 | Farkas et al. | 438/627 |
| 6,039,633 A | 3/2000 | Chopra | 451/41 |
| 6,046,099 A | 4/2000 | Cadien et al. | 438/622 |
| 6,051,496 A | 4/2000 | Jang | 438/687 |
| 6,060,386 A | 5/2000 | Givens | 438/626 |

(Continued)

FOREIGN PATENT DOCUMENTS

WO     00/28586     5/2000

*Primary Examiner*—Duy-Vu N. Deo
*Assistant Examiner*—Binh X. Tran
(74) *Attorney, Agent, or Firm*—Whyte Hirschboeck Dudek SC

(57) ABSTRACT

A method for substantially simultaneously polishing a copper conductive structure of a semiconductor device structure and an adjacent barrier layer. The method includes use of a polishing pad with a slurry solution in which copper and a material, such as tungsten, of the barrier layer are removed at substantially the same rate. The slurry is formulated so as to oxidize copper and a material of the barrier layer at substantially the same rates. Thus, copper and the barrier layer material have substantially the same oxidation energies in the slurry. Systems for substantially polishing copper conductive structures and adjacent barrier structures on semiconductor device structures are also disclosed.

37 Claims, 5 Drawing Sheets

U.S. PATENT DOCUMENTS

| | | |
|---|---|---|
| 6,060,395 A | 5/2000 | Skrovan et al. .............. 438/692 |
| 6,063,306 A * | 5/2000 | Kaufman et al. ........... 252/79.4 |
| 6,066,559 A | 5/2000 | Gonzalez et al. ............ 438/672 |
| 6,068,787 A | 5/2000 | Grumbine et al. ......... 252/79.1 |
| 6,083,840 A | 7/2000 | Mravic et al. .............. 438/693 |
| 6,100,197 A | 8/2000 | Hasegawa ................... 438/687 |
| 6,136,711 A | 10/2000 | Grumbine et al. ............ 216/89 |
| 6,196,899 B1 | 3/2001 | Chopra et al. ................. 451/56 |
| 6,206,756 B1 | 3/2001 | Chopra et al. ................. 451/28 |
| 6,228,771 B1 | 5/2001 | Allers ......................... 216/89 |
| 6,250,994 B1 | 6/2001 | Chopra et al. ................. 451/56 |
| 6,273,786 B1 | 8/2001 | Chopra et al. ................. 451/28 |
| 6,276,996 B1 | 8/2001 | Chopra ........................ 451/41 |
| 6,313,038 B1 | 11/2001 | Chopra et al. .............. 438/692 |
| 6,328,632 B1 | 12/2001 | Chopra ........................ 451/41 |
| 6,409,781 B1 * | 6/2002 | Wojtczak et al. .............. 51/308 |
| 6,436,302 B1 * | 8/2002 | Li et al. ....................... 216/38 |
| 6,551,935 B1 * | 4/2003 | Sinha et al. ................ 438/693 |
| 6,561,883 B1 * | 5/2003 | Kondo et al. ................. 451/63 |
| 6,576,551 B1 * | 6/2003 | Chang et al. ............... 438/690 |
| 6,596,637 B1 * | 7/2003 | Schonauer et al. ......... 438/687 |
| 6,602,117 B1 | 8/2003 | Chopra et al. |
| 6,632,377 B1 * | 10/2003 | Brusic et al. .............. 252/79.1 |

\* cited by examiner

SLURRY FOR USE IN POLISHING SEMICONDUCTOR DEVICE CONDUCTIVE STRUCTURES THAT INCLUDE COPPER AND TUNGSTEN AND POLISHING METHODS

CROSS REFERENCE TO RELATED APPLICATION

This application is a is a Continuation of U.S. patent application Ser. No. 09/653,392, filed Aug. 31, 2000, now U.S. Pat. No. 6,551,935.

FIELD OF THE INVENTION

The present invention relates generally to slurries that are useful in chemical-mechanical polishing or chemical mechanical planarization processes and, more specifically, to slurries that are used to polish or planarize electrically conductive structures of semiconductor devices that include copper and an adjacent tungsten-containing barrier. The present invention also relates to methods for substantially concurrently polishing or planarizing structures formed from copper and tungsten.

BACKGROUND OF THE INVENTION

CMP

Chemical-mechanical polishing and chemical-mechanical planarization, both of which are referred to in the art as "CMP", are abrasive techniques that typically include the use of a combination of chemical and mechanical agents to planarize, or otherwise remove material from or planarize a surface of a semiconductor material substrate during the fabrication of devices thereon. A chemical component, typically a slurry that includes one or more oxidizers, abrasives, complexing agents, and inhibitors, oxidizes the surface of one or more material layers that are being polished or planarized (i.e., at least partially removed). A polishing pad formed from a material such as polyurethane or acrylic is used with the slurry and, in combination with abrasives present in the slurry, effects mechanical removal of the layer or layers from the surface of the semiconductor device structure. It should be noted that abrasive-only polishing and planarization, e.g., without the use of active chemical agents to effect material removal, are becoming more prevalent due to environmental concerns. Thus, the term "CMP" as used herein encompasses such abrasive-only (i.e., strictly mechanical) methods and apparatus.

Copper Conductive Structures

The use of copper as a conductive material in semiconductor devices is also ever increasing. When copper is used in semiconductor devices, however, a barrier layer is typically required between the copper and adjacent structures or layers. The barrier layer prevents diffusion of the copper into the adjacent layers or structures, as well as the formation of copper silicides, both of which may cause electrical shorts in semiconductor devices that include copper. Tantalum is an example of a material that is useful as a copper barrier. When tantalum is used, the semiconductor device, including any features thereof into which copper is to be disposed (e.g., trenches), is lined with a layer of tantalum. The tantalum layer is then typically covered with a thin copper layer, often formed by physical vapor deposition ("PVD") processes. The thin copper layer then acts as a so-called "seed layer" for the formation of a copper structure, such as a conductive line, such as by electroplating processes.

Once the tantalum and copper layers have been formed, it is necessary to isolate separate tantalum-copper conductive structures from one another. CMP processes are typically used to remove the tantalum and copper between the structures from over the active surface of the semiconductor device being fabricated. Slurries that are used in copper CMP processes typically have a pH of about 7.0. Many of these slurries include hydrogen peroxide ($H_2O_2$) as an oxidizing agent. Since hydrogen peroxide readily generates hydroxy free radicals (OH), hydrogen peroxide is a very strong oxidizing agent. Tantalum, however, is substantially chemically inert Thus, the oxidizers of CMP slurries that remove copper do not effectively oxidize tantalum and, thus, do not adequately effect the removal of tantalum. Likewise, slurries that are useful for removing tantalum by CMP processes are likewise not effective for removing copper. As a result, when conventional CMP processes are used to isolate the tantalum-copper conductive structures of a semiconductor device, two separate slurries must be used.

It has been proposed that tungsten be used in place of tantalum in semiconductor devices as a barrier material for copper conductive structures. Nonetheless, when known copper CMP slurries are used to substantially simultaneously CMP tungsten and copper, the tungsten barrier layer may dissolve, or be removed, at a faster rate than the copper. This is at least partially because, as the following chemical equations illustrate, tungsten (W) is more readily oxidized than copper (Cu):

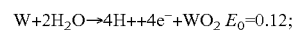

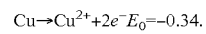

Thus, in conventional slurries, although both copper and tungsten are simultaneously exposed to the same oxidants, the tungsten will typically be oxidized first. As a result, gaps may form in locations where the barrier material should be located between copper conductive structures and adjacent portions of the semiconductor device structure upon which the conductive structures are being fabricated.

This phenomenon is illustrated in the electron micrograph of FIG. 1, which illustrates a semiconductor device structure 10 that includes the portions of a copper layer 20 and an underlying tungsten barrier layer 18 disposed within a recess 14 formed in an active surface 16 of a substrate 12 of semiconductor device structure 10 following CMP thereof using an alumina fixed-abrasive polishing pad and a copper CMP slurry having a pH of about 7. Once an interface 19 between barrier layer 18 and copper layer 20 was exposed during the CMP process, tungsten of barrier layer 18 was oxidized and dissolved at a faster rate than the adjacent copper of copper layer 20, leaving a gap 21 between copper layer 20 and adjacent regions of substrate 12, as well as undesirably permitting copper of copper layer 20 to contact and, possibly, diffuse into, unprotected adjacent regions of substrate 12.

Therefore, it would is desirable to provide a slurry that is useful in CMP processes and that effectively polishes or planarizes both copper and tungsten without causing oxidation or dissolution of the tungsten.

SUMMARY OF THE INVENTION

The present invention includes a method for substantially simultaneously chemical-mechanical polishing a copper conductive structure and an adjacent barrier layer with a polishing pad, as well as slurries that are useful for substantially simultaneously polishing a copper conductive structure and a barrier layer adjacent thereto.

The method of the present invention includes employing a polish pad along with a liquid polishing formulation, which is generally referred to herein as a slurry. The slurry is formulated to oxidize copper and a material of the barrier layer, such as tungsten, at substantially the same rates and without preference between the two materials. Thus, in a slurry incorporating teachings of the present invention, the oxidation energies of copper and the barrier material are substantially the same. Preferably, in the slurry, the oxidation energy of a barrier material, such as a tungsten-containing material (e.g., tungsten (W) and tungsten nitride $WN_x$) is about 0.25 volt greater to about 0.2 volt less than an oxidation energy of copper. As copper and the barrier material are oxidized by the slurry at about the same rates, use of a slurry so formulated to substantially simultaneously polish a copper conductive structure and an adjacent barrier layer, prevents dissolution of the barrier layer.

Slurries that are useful in the method of the present invention include at least one oxidizer, at least on inhibitor, and one or more abrasives, and optionally but preferably one or more complexing agents. The relative amounts of the oxidizer, inhibitor, abrasive, and optional complexing agent, are balanced so as to facilitate substantially concurrent polishing of a copper structure and another structure adjacent thereto, such as a barrier layer formed from a tungsten-containing material. Thus, the slurry is formulated such that the relative amounts of the oxidizer, inhibitor, abrasive, and optional complexing agent, to oxidize copper and a barrier material, such as a tungsten-containing material, at substantially the same rates, or such that the oxidation energies of copper and the barrier material are substantially the same in the slurry, and to polish or planarize the surface of the wafer or other structure. The pH of the slurry is also be optimized so as to provide for oxidation of copper and a barrier material, such as a tungsten-containing material, at substantially the same rates.

With such exemplary solutions in accordance with the invention received intermediate the wafer and polishing pad, the copper comprising layer is chemical-mechanical polished with slurry and the polishing pad. The slurries can be utilized with a conventional planarizing machine known and used in the art for chemical-mechanical polishing a semiconductor wafer.

The present invention also includes a system for substantially simultaneously polishing a copper conductive structure and an adjacent barrier layer of a semiconductor device. Such a system includes a polishing pad and a slurry according to the invention, within which copper and the material of the barrier layer are oxidized at substantially the same rates, or have substantially the same oxidation energies.

Other features and advantages of the present invention will become apparent to those of ordinary skill in the art through consideration of the ensuing description, the accompanying drawings, and the appended claims.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
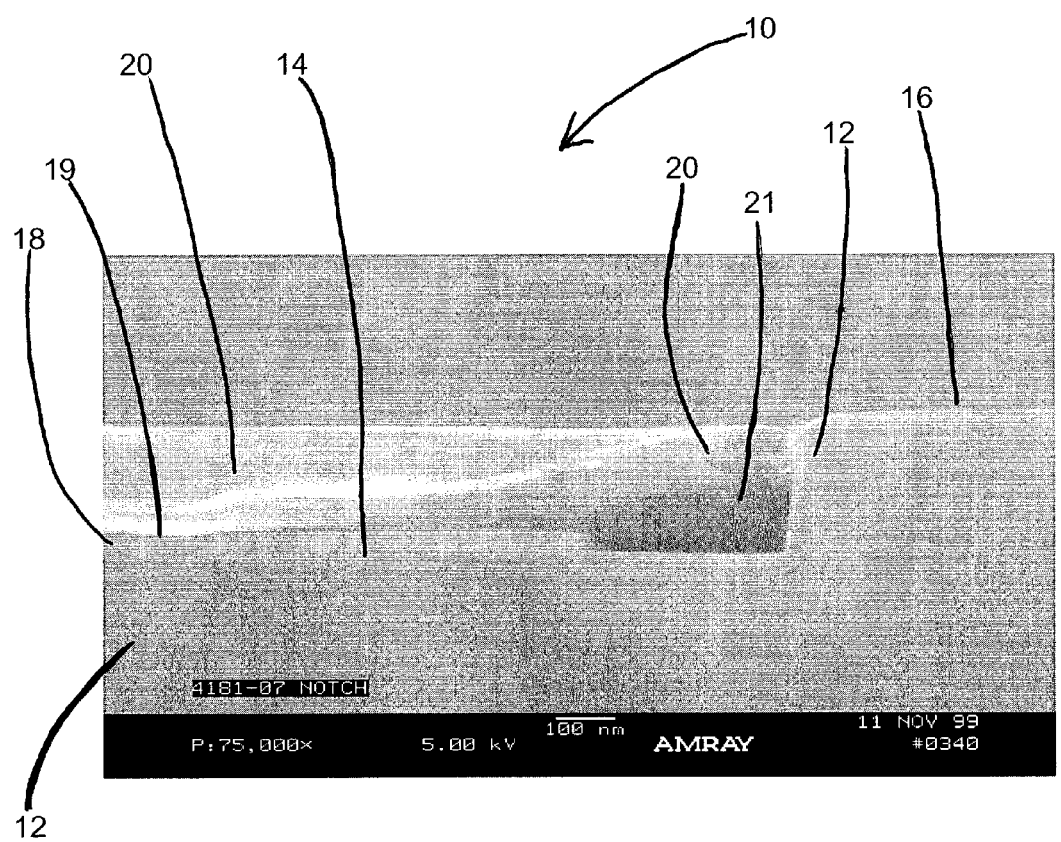
FIG. 1 is an electron micrograph illustrating the dissolution of regions of a tungsten barrier layer that underlie a copper structure of a semiconductor device structure when a conventional slurry is used to simultaneously remove the copper and tungsten.
Figure 2:
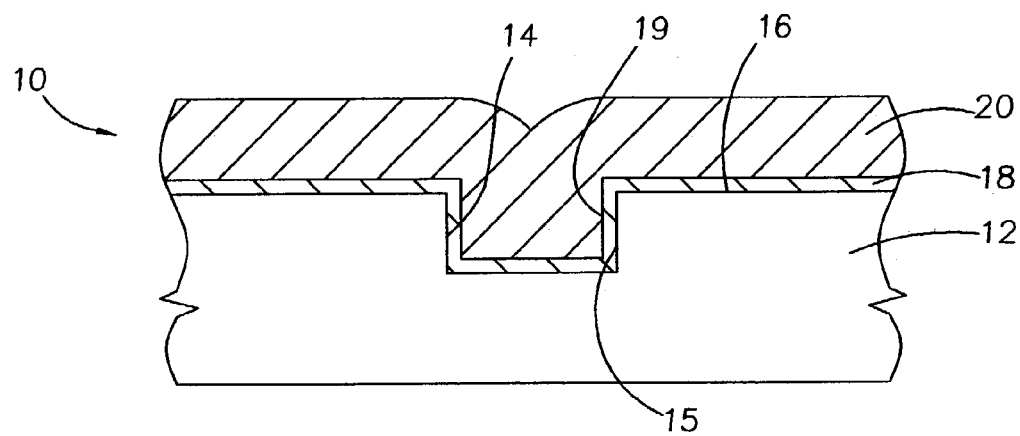
FIGS. 2–5 schematically illustrate an exemplary embodiment of a polishing method in which copper and a barrier material therefor are substantially simultaneously removed from a semiconductor device structure at substantially the same rates.

A method incorporating teachings of the present invention is illustrated in FIGS. 2–5. With reference to FIG. 2, a semiconductor device structure 10 including a substrate 12, which includes a recess 14 formed in an active surface 16 thereof. A barrier layer 18 of a material, such as a tungsten-containing material, that prevents copper from diffusing into adjacent insulative regions of semiconductor device structure 10 located on active surface 16 and on the surfaces 15 of recess 14. Preferably, the tungsten-containing material comprises greater than about 50% tungsten. Exemplary tungsten-containing materials include tungsten (W) and tungsten nitride having the formula $WN_x$. A copper layer 20 is formed over and contacts barrier layer 18. Copper layer 20 also substantially fills recess 14. Although substrate 12 may include various other structures beneath recess 14, barrier layer 18, and copper layer 20, for purposes of simplicity, no additional structures are illustrated in the semiconductor device structure 10 shown in FIGS. 2–5.

Figure 3:
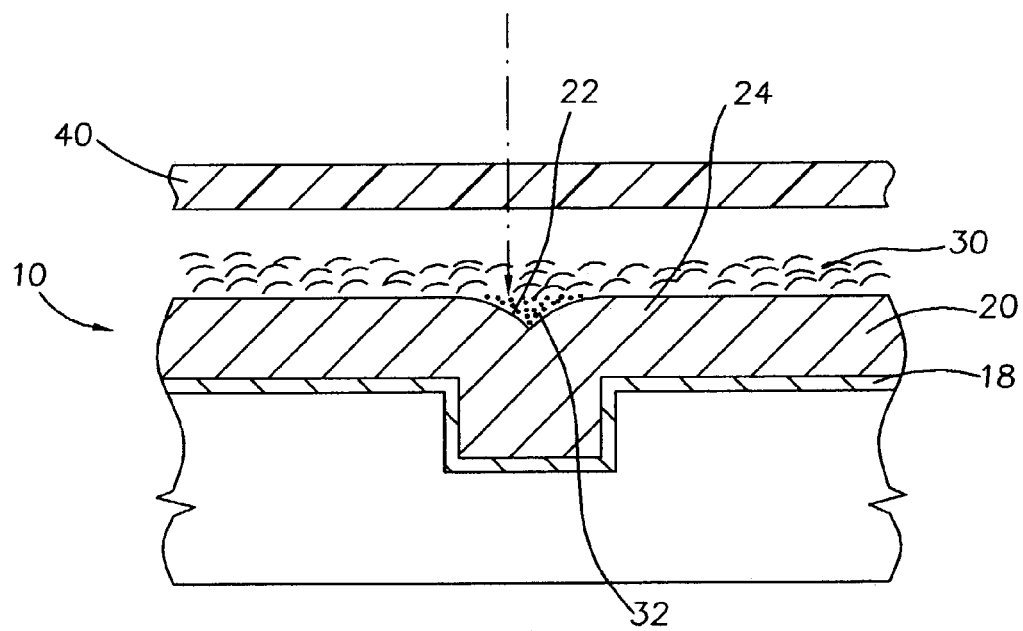

In forming a conductive structure from copper layer 20, portions of copper layer 20 and of barrier layer 18 that are not located within recess 14 must be removed from semiconductor device structure 10. As discussed previously herein, CMP processes are typically used to remove unwanted portions of copper layers. With reference to FIG. 3, a slurry 30 is applied over copper layer 20. A polishing pad 40, which may be embodied as a conventional polishing pad, a web-type polishing pad, a belt-type polishing pad, or in any other polishing pad format known in the art, is then brought into frictional contact (e.g., by rotation of semiconductor device structure 10 or movement of the polishing pad 40) with copper layer 20 to, along with slurry 30, remove copper layer 20. An inhibitor component 32 of slurry 30 fills recessed areas 22 of copper layer 20, thereby preventing removal of material from recessed areas 22 until material of higher areas 24 of copper layer 20 has been removed.

Figure 4:
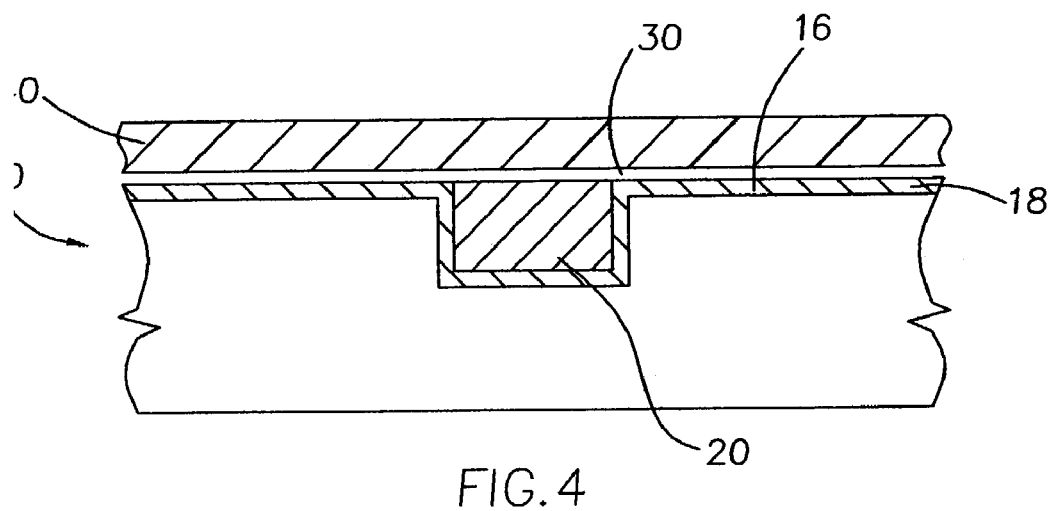

Eventually, regions of barrier layer 18 overlying active surface 16 are exposed through copper layer 20, as shown in FIG. 4. At this point, slurry 30 and polishing pad 40 remove the material or materials of barrier layer 18 and the copper of copper layer 20 at substantially the same rates.

Figure 5:
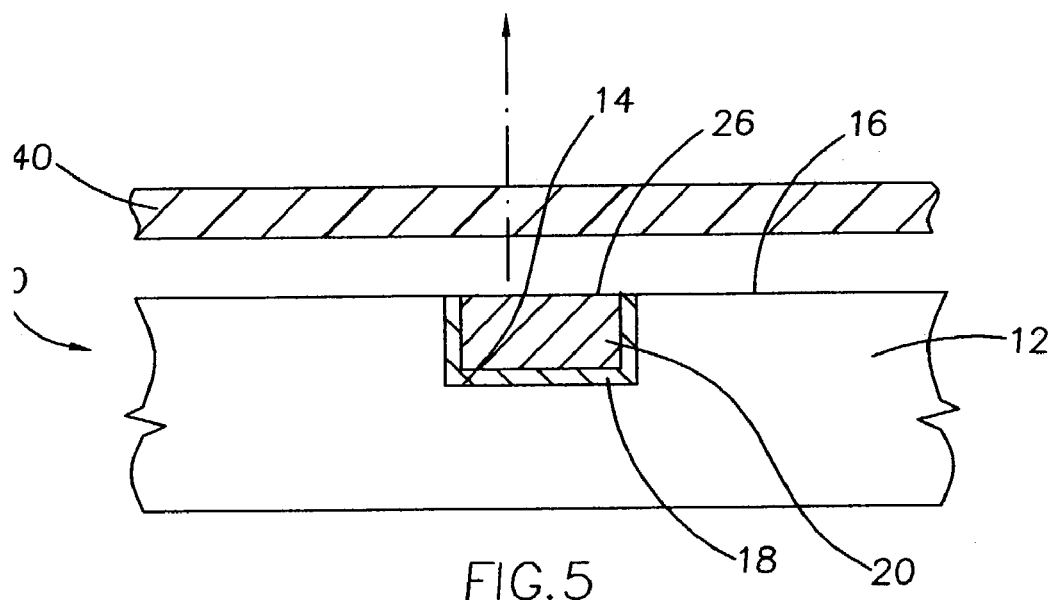

Barrier layer 18 is removed from active surface 16 by continued polishing with slurry 30 and polishing pad 40. Once barrier layer 18 is substantially removed from active surface 16 and the surface 26 of the portion of copper layer 20 that remains within recess 14 is located substantially in the plane of active surface 16, as depicted in FIG. 5, the polishing process is terminated. As illustrated in FIG. 5, the remaining portion of barrier layer 18 substantially lines recess 14 and separates the remaining portion of copper layer 20 from adjacent portions of substrate 12.

In order to effect removal of copper and the material or materials (e.g., tungsten-containing material) of an adjacent barrier layer 18 or other structure by CMP at substantially the same rates, slurry 30 is formulated so as to oxidize copper and the material or materials of the adjacent barrier layer 18 at substantially the same rates. Stated another way, copper and the material or materials (e.g., tungsten-containing material) of the adjacent barrier layer 18 have substantially the same oxidation energies in slurry 30. As a result, as an interface 19 between layers 18 and 20 is exposed to slurry 30, the material or materials of barrier layer 18 will not dissolve, or be removed from semiconductor device structure 10, at a significantly greater rate than copper or copper layer 20 is dissolved, or removed from semiconductor device structure 10. To achieve the desired removal, the oxidation energy of the tungsten-comprising material in slurry 30 is preferably about 0.25 volt more to about 0.2 volt less than the oxidation energy of copper in slurry 30.

Slurry 30 includes an oxidizer component, which oxidizes both the copper of copper lay 20 and the material or materials (e.g., tungsten-containing material) of barrier layer 18 so as to chemically soften these materials and to thereby facilitate their mechanical removal from semiconductor device structure 10 by polishing pad 40. Slurry 30 includes an inhibitor component 32, which prevents recessed, or lower, areas 22 of copper layer 20 from being removed until higher areas 24 of copper layer 20 have been removed down to substantially the same plane. Slurry 30 further includes an abrasive agent, which effects the mechanical part of the CMP process to abrade and polish or planarize the surface of the semiconductor device 10, in combination with polishing pad 40. As a result, the continued oxidation of material layers 18, 20 by slurry 30 may occur at optimal rates and, thus, the rates at which the materials of layers 18 and 20 are removed from semiconductor device structure 10 may also be optimized.

According to the invention, to achieve an optimal and balanced rate of removal of the copper and tungsten-containing barrier layers at substantially the same rates, and without preferential etching of one material over the other, the slurry is formulated to achieve a $\Delta E$ range of about 0.05 eV to about 0.20 eV, by optimizing the oxidizer component and the pH of the slurry.

The amount of oxidizer included in the slurry is controlled to maintain an about equal rate of selectivity between the copper of copper layer 20 and the material or materials (e.g., tungsten-containing material) of barrier layer 18. Examples of oxidizers that are useful as the oxidizer component of slurry 30 include, without limitation, hydrogen peroxide, ammonium persulfate, potassium iodate, potassium permanganate, ferric nitrate, and cerium (IV) compounds such as ceric nitrate and ceric ammonium nitrate, bromates, chlorates, chromates, and iodic acid, and mixtures thereof. The oxidizer component preferably comprises about 0.05% to about 10% by weight of slurry 30, preferably about 0.1% to about 5.0% by weight, more preferably about 3% to about 5% of the weight of slurry 30. The oxidizing agent is preferably not as strong as, for example, hydrogen peroxide or an organic peroxide such as monopersulfates, which have a relatively high static etch rate of the tungsten-containing material. Thus, a "dual" oxidizer can be used comprising the foregoing oxidizing agents combined with a minimal amount of hydrogen peroxide or ammonium persulfate, of about 0.001% to about 1% to about 2% by weight of the slurry.

Examples of useful copper corrosion inhibitors 32 include azoles such as imidazole, benzotriazole, benziimidazole, benzothizole, mercaptabenzothiazole and tolytriazole, and other azole derivatives with hydroxy, amino, imino, carboxy, mercapto, nitro and alkyl substituted groups; urea and thiourea; amines such as methylamine and diethylamine; ring compounds such as pyridine, quinoline, and dicyclohexamine nitrite; other compounds such as potassium silicate, ammonium borate, ammonium phosphate and potassium dichromate; and mixtures thereof. Inhibitor component 32 of slurry 30 preferably includes an azole compound, such as benzenetriazole (BTA). While inhibitor component 32 may make up about 0.05% to about 2% by weight of slurry 30, it is preferred the inhibitor component 32 comprise about 0.05% to about 0.2% by weight of slurry 30. For example, slurry 30 may include about 0.1% BTA, by weight.

Examples of useful abrasive agents include, but are not limited to, alumina ($Al_2O_3$), titanium dioxide ($TiO_2$), silicon dioxide ($SiO_2$), and cerium dioxide ($CeO_2$). The abrasive preferably comprises about 0.5% to about 10% by weight of slurry 30.

Slurry 30 can have a pH in the range of about 3 to about 7, but the pH of slurry 30 is optimally in the range of about 3 to about 5. One or more pH control agents or buffers may be used, as known in the art, to adjust the pH of slurry 30 to a desired level. Preferably, the pH control agent will adjust the pH of slurry 30 to a desirable range or point without significantly etching the insulator (e.g., borophosphosilicate glass (BPSG), phosphosilicate glass (PSG), or borosilicate glass (BSG)) that underlies the layer or layers being polished. Examples of useful pH control agents include potassium hydrogen phthalate, ammonium phosphate, ammonium acetate, ammonium dihydrogen phosphate, dibasic ammonium citrate, ammonium hydrogen phosphate, tribasic ammonium citrate, ammonium oxalate, ammonium carbamate, acetic acid, phosphoric acid, and sulfuric acid, among others, and mixtures thereof.

In a preferred embodiment, slurry 30 also includes one or more complexing agents, which complex with ions of the layers 18, 20 being removed (e.g., copper ions from copper layer 20) so as to facilitate the dissolution of these reactant ions, allowing these reactant ions to be moved away from the locations at which layers 18 and 20 are being oxidized. Examples of suitable complexing agents of slurry 30 may include, but are not limited to, glycine, ammonium citrate, ammonium phosphate, ammonium acetate, ammonium thiocyanate, and 2,4-pentadione, and combinations thereof. Slurry 30 preferably includes about 1% to about 10% of the one or more complexing agents, by weight of slurry 30, more preferably about 3% to about 5% by weight of slurry 30. For example, slurry 30 may include about 1% of the complexing agent glycine, including a concentration of 0.1 M (molar) polyethylene glycol (PEG), by weight of slurry 30. As another example, slurry 30 may include about 3% ammonium acetate, by weight.

The slurry solution can also comprise one or more surfactants, for example present at a concentration of from about 1% to about 10% by volume. Example surfactants include dodecyl sulfate sodium salt, sodium lauryl sulfate, dodecyl sulfate ammonium salt, polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof. The slurry can further comprise one or more thickeners to achieve a desired viscosity, with an example preferred range being from about 10 centipoise to about 20 centipoise at room temperature. Examples of suitable thickeners include Polyox™ available from Union Carbide of Danbury, Conn., and Carbopol™ available from B. F. Goodrich of Cleveland, Ohio.

The specific amounts of the components of slurry 30 may be determined by identifying slurry 30 formulations in which copper gives up electrons at substantially the same rate as a barrier material, such a tungsten-containing material, of a barrier layer 18 to be polished substantially simultaneously with copper layer 20. Stated another way, slurry 30 may be formulated so that copper and a barrier material therefor, such as a tungsten-containing material, have the substantially same oxidation energies therein, or are oxidized at substantially the same rates therein. Preferably, the oxidation energy of the tungsten-containing material or another barrier material in slurry 30 is within the range of about 0.25 volt more than to about 0.2 volt less than the oxidation energy of copper in slurry 30, the range including the end point values thereof. These formulations of slurry 30 will facilitate the removal of copper and a barrier material, such as a tungsten-containing material, from a semiconductor device structure 10 at substantially the same rates.

Slurry 30 formulations having these characteristics may be determined as known in the art, such as by measuring the open circuit potentials of copper and a barrier material, such as tungsten, in slurry 30.

Figure 6:
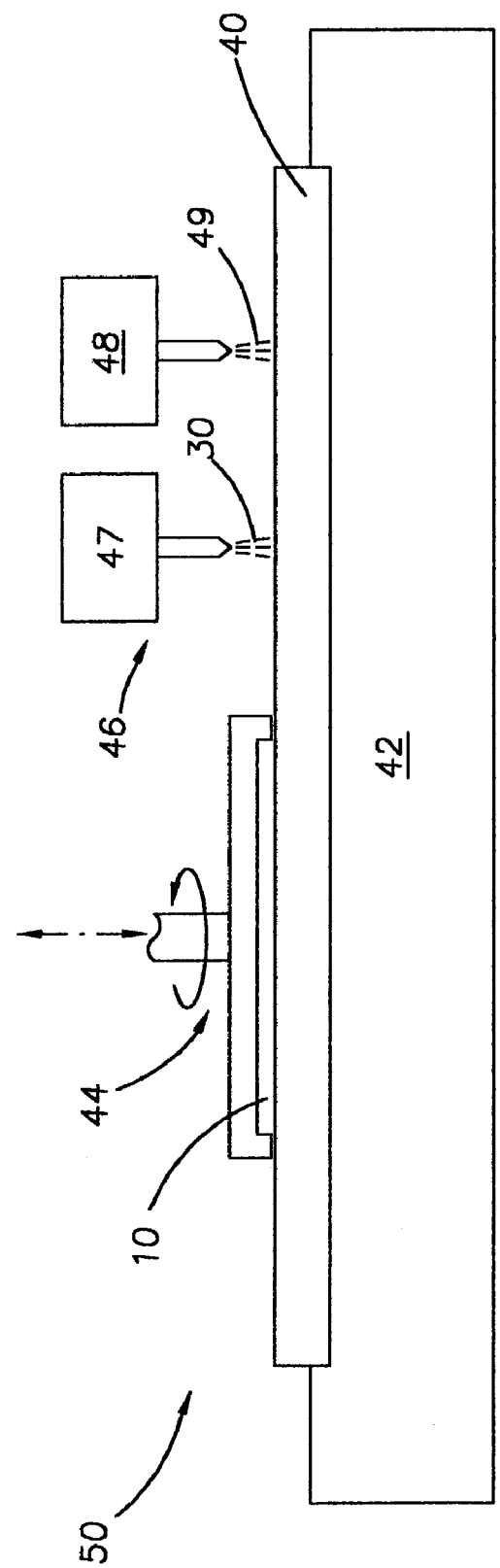
FIG. 6 is a schematic representation of an exemplary embodiment of a system that employs a polishing pad and a slurry to effect the method of the present invention.

Referring now to FIG. 6, a polishing system 50 for effecting the substantially simultaneous polishing of copper and an adjacent barrier material in accordance with the method of the present invention is illustrated. Polishing system 50 includes a polishing apparatus 42, which supports or carries a polishing pad 40, and a substrate support 44 configured to hold a semiconductor device structure 10, to bring the same into frictional contact with polishing pad 40, and, preferably, to rotate semiconductor device structure 10 relative to polishing pad 40. Polishing system 50 also includes a slurry applicator 46 and a rinsing element 48.

Any known CMP apparatus, including conventional, rotary CMP apparatus, web format CMP apparatus, and belt format CMP apparatus, may comprise polishing apparatus 42, substrate support 44, slurry applicator 46, and rinsing element 48 of polishing system 50.

Conventional CMP pads are round, planar, and have larger dimensions than the semiconductor substrates (e.g., wafers or other substrates including silicon, gallium arsenide, indium phosphide, etc.) upon which the structures or layers to be planarized or otherwise polished have been formed. In polishing one or more layers or structures formed on a substrate, the substrate and the conventional CMP pad are rotated relative to one another, with the location of the substrate being moved continuously relative to the polishing surface of the pad so that different areas of the pad are used to polish one or more of the layers or structures formed on the substrate.

In use of polishing system 50, one or more semiconductor device structures 10 having one or more layers thereon that are to be chemical-mechanical polished are secured to substrate support 44. If necessary, polishing pad 40 is also secured to polishing apparatus 42. Slurry 30 from a slurry source 47 is introduced by slurry applicator 46 onto semiconductor device structure 10 and, once slurry 30 has been applied, one or both of semiconductor device structure 10 and polishing pad 40 are substantially continuously laterally moved (e.g., rotate or vibrated or otherwise moved side-to-side) and brought into frictional contact with one another so as to effect the CMP process.

In some instances, it would be desirable to maintain a temperature at or below room temperature during the copper polish (i.e., at or below 74° F. to about 65° F.). This is seldom practical where lower slurry temperature will also result in poor abrasive material dispersal throughout the slurry during polish. Accordingly, elevated temperatures are utilized during the polish. Polishing in all embodiments preferably is conducted at atmospheric pressure and anywhere from 40° F. up to 145° F., although other conditions are of course possible.

Once the desired portions of one or more layers 18, 20 (FIGS. 2–5) have been removed from semiconductor device structure 10, semiconductor device structure 10 is moved away from polishing pad 40 and slurry 30 remaining on semiconductor device structure 10 is rinsed therefrom by a rinse liquid 49 from rinsing element 48. Subsequent fabrication processes may then be conducted on semiconductor device structure 10, as known in the art.

Another polishing format is the so-called "web" format, wherein the pad has an elongate, planar configuration. The web is moved laterally from a supply reel to a take-up reel so as to provide "fresh" areas thereof for polishing one or more layers or structures formed on a semiconductor substrate. A similar, newer, polishing format is the so-called "belt" format, wherein the pad is configured as a belt, or continuous loop, of polishing material. In both the "web" and "belt" formats, the semiconductor substrate is rotated or revolved upon being brought into contact with the pad. The pad is moved when a "fresh" polishing surface is needed or desired.

Figure 7:
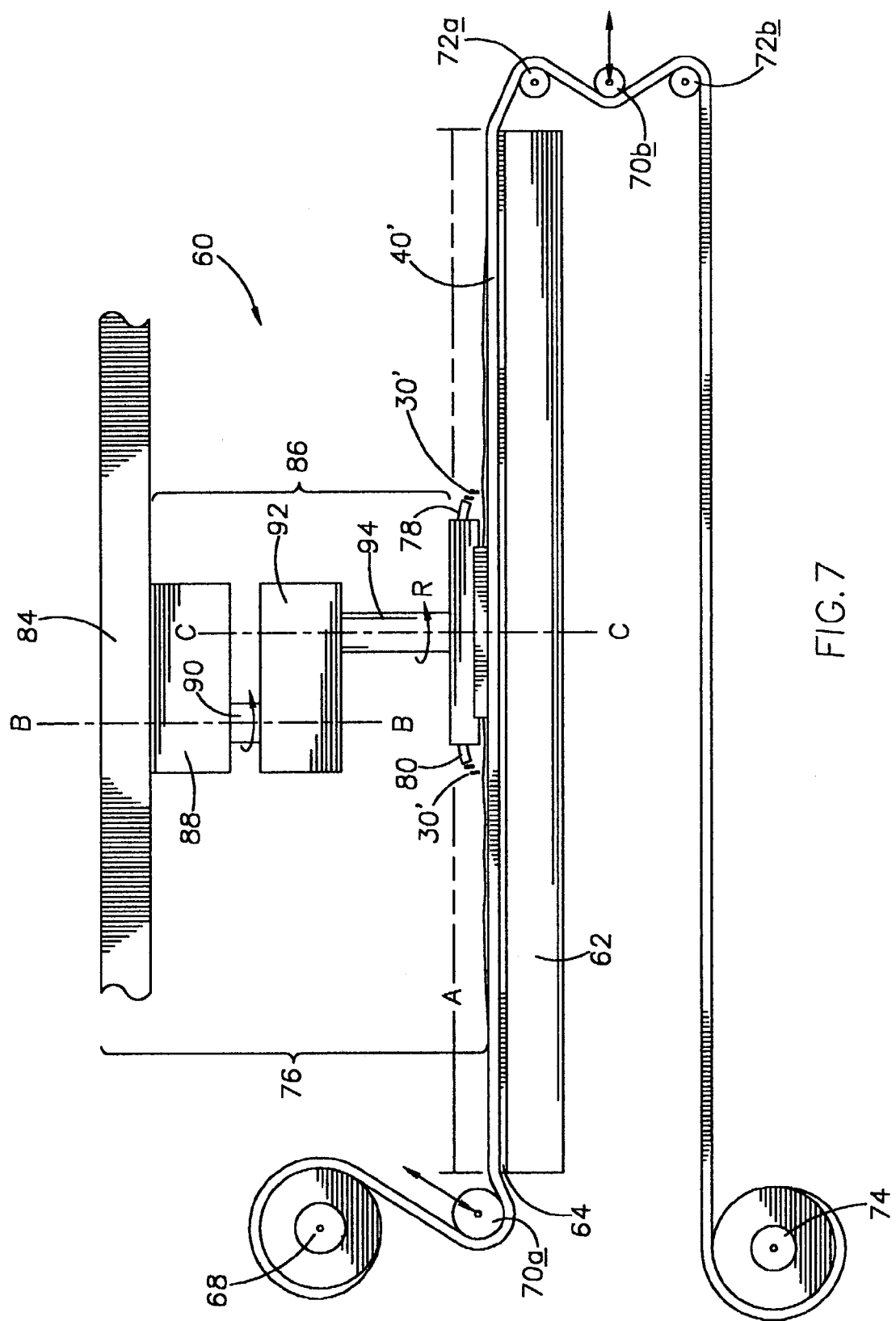
FIG. 7 is a schematic representation of an exemplary embodiment of a system that employs a web-format planarizing machine to effect the method of the present invention.

Example equipment and processing utilized in accordance with the invention is described with reference to FIG. 7, wherein a web-format planarizing machine 60 is used for chemical-mechanical polishing a semiconductor wafer (not shown). Planarizing machine 60 has a support table 62 with a top panel 64 at a work station where an operative portion (A) of a planarizing pad 40' is positioned. The top-half panel 64 is generally a rigid plate to provide a flat, solid surface to which a particular section of planarizing pad 40' may be secured during polishing.

Planarizing machine 60 also has a plurality of rollers to guide, position and hold planarizing pad 40' over top panel 64. The rollers include a supply roller 68, first and second idler rollers 70a and 70b, first and second guide rollers 72a and 72b, and a take-up roller 74. The supply roller 68 carries an unused or pre-operative portion of the planarizing pad 40', and take-up roller carries a used or post-operative portion of planarizing pad 40'. First idler roller 70a and first guide roller 72a stretch planarizing pad 40' over top panel 64 to hold the planarizing pad 40' stationary during operation. Planarizing pad 40' in accordance with the invention preferably comprises a fixed abrasive pad, such as described above, and having a length greater than a maximum diameter of the wafers being polished. A motor (not shown) derives at least one of supply roller 68 and take-up roller 74 to sequentially advance the planarizing pad 40' across the top-panel 64. As such, clean pre-operative sections of the planarizing pad 40' may be quickly substituted for used sections to provide a consistent surface for planarizing and/or cleaning the substrate.

The web-format planarizing machine 60 has a carrier assembly 76 that controls and protects the wafer during polishing. Carrier assembly 76 generally has a substrate holder 78 to pick up, hold and release the wafer at appropriate stages of the polishing cycle. A plurality of nozzles 80 attached to substrate holder 78 dispense a planarizing solution 30' in accordance with the invention onto a planarizing surface 82 of planarizing pad 40'. Carrier assembly 76 also generally has a support gantry 84 carrying a drive assembly 86 that translates along gantry 84. Drive assembly 86 generally has an actuator 88, a drive shaft 90 coupled to the actuator 88, and an arm 92 projecting from drive shaft 90. Arm 92 carries substrate holder 78 via another shaft 94 such that drive assembly 86 orbits substrate holder 78 about an axis B—B offset from a center point C—C of the wafer.

In accordance with an aspect of the invention, the process preferably comprises moving web/pad 40' a distance less than the maximum diameter of the wafer such that a subsequently polished wafer is exposed to a fresh pad segment which was not utilized to polish the immediately preceding wafer. Preferably, the distance moved is less than or equal to about 1.0% of the maximum diameter for uniformity of polish and to extend life of the pad. For example for an 8-inch diameter wafer, an incremental movement of pad/web 40' between each polishing is about 0.25 inch.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. The complete disclosures of all patents, patent documents, and publications listed herein are incorporated by reference, as if each were individually incorporated by reference.

What is claimed is:

1. A solution for CMP processing of a semiconductor substrate, the solution comprising:
    effective amounts of about 3–10% by weight of an oxidizer and about 0.05–0.2% by weight of an inhibitor to remove a copper material and a tungsten barrier material from the semiconductor substrate at about the same rate, the solution having a pH of about 3–7.

2. The solution of claim 1, wherein the oxidizer is selected from the group consisting of an ammonium compound, a nitrate compound, and an amine compound.

3. The solution of claim 1, wherein the oxidizer is selected from the group consisting of hydrogen peroxide, potassium iodate, potassium permanganate, ammonium persulfate, ammonium molybdate, ferric nitrate, nitric acid, potassium nitrate, and ammonia.

4. The solution of claim 1, comprising about 1–10% complexing agent by weight of the solution.

5. The solution of claim 1, further comprising a thickener.

6. The solution of claim 1, further comprising a pH control agent.

7. The solution of claim 6, wherein the pH control agent is selected from the group consisting of potassium hydrogen phthalate, ammonium acetate, ammonium oxalate, ammonium carbamate, ammonium phosphate, ammonium hydrogen phosphate, ammonium dihydrogen phosphate, dibasic ammonium citrate, tribasic ammonium citrate, acetic acid, phosphoric acid, and sulfuric acid.

8. The solution of claim 1, further comprising an abrasive.

9. The solution of claim 8, wherein the abrasive is selected from the group consisting of alumina, titanium dioxide, silicon dioxide, and cerium dioxide.

10. The solution of claim 8, comprising about 0.05–10% by weight abrasive.

11. The solution of claim 1, further comprising a complexing agent.

12. The solution of claim 11, wherein the complexing agent is selected from the group consisting of glycine, ammonium citrate, ammonium phosphate, ammonium acetate, ammonium thiocyanate, and 2,4-pentadione.

13. The solution of claim 1, further comprising a surfactant.

14. The solution of claim 13, wherein the surfactant is selected from the group consisting of polyethylene glycol, polyoxyethylene ether, glycerol, polypropylene glycol, polyoxyethylene lauryl ether, polyoxyethylene cetyl ether, polyoxyethylene stearyl ether, and polyoxyethylene oleyl ether.

15. A solution for CMP processing of a semiconductor substrate, the solution comprising:
    an oxidizer in combination with about 0.05–0.2% by weight of an inhibitor in amounts effective to remove a copper material and a tungsten barrier material from the semiconductor substrate at about the same rate, the solution having a pH of about 3–7.

16. A solution for CMP processing of a semiconductor substrate, the solution comprising:
    effective amounts of an oxidizer and an inhibitor selected from the group consisting of benzotriazole, mercaptabenzothiazole, tolytriazole, methylamine, diethylamine, pyridine, quinoline, dicylohexamine nitrate, potassium silicate, ammonium borate, ammonium phosphate, and potassium dichromate, to remove a copper material and a tungsten barrier material from the semiconductor substrate at about the same rate, the solution having a pH of about 3–5.

17. The solution of claim 16, comprising about 0.05–10% by weight oxidizer and about 0.05–2% inhibitor.

18. A solution for CMP processing of a semiconductor substrate, the solution comprising:
    about 0.05–10% of an oxidizer and about 0.05–2% by weight of an inhibitor selected from the group consisting of benzotriazole, mercaptabenzothiazole, tolytriazole, methylamine, diethylamine, pyridine, quinoline, dicylohexamine nitrate, potassium silicate, ammonium borate, ammonium phosphate, and potassium dichromate, to remove a copper material and a tungsten barrier material from the semiconductor substrate at about the same rate; the solution having a pH of about 3–7.

19. A solution for CMP processing of a semiconductor substrate, the solution comprising:
    effective amounts of about 3–5% by weight of a dual oxidizer and about 0.05–0.2% by weight of an inhibitor to remove a copper material and a tungsten-containing barrier material from the semiconductor substrate at about the same rate, the dual oxidizer comprising a first oxidizer, and up to about 2% by weight of a second oxidizer selected from the group consisting of hydrogen peroxide and ammonium persulfate, the solution having a pH of about 3–7.

20. A solution for CMP processing of a semiconductor substrate, the solution comprising:
    effective amounts of about 3–10% by weight of a first oxidizer and a second oxidizer, and about 0.05–0.2% by weight of an inhibitor to remove a copper material and a barrier material from the semiconductor substrate at about the same rate;
    wherein the first oxidizer is selected from the group consisting of potassium iodate, potassium permanganate, ferric nitrate, cerium (IV) compounds, bromates, chlorates, chromates, iodic acid, ammonium molybdate, nitric acid, potassium nitrate, amine compounds, and ammonia;

the second oxidizer is selected from the group consisting of hydrogen peroxide and ammonium persulfate; and the solution comprises about 2% by weight or less of the second oxidizer, and has a pH of about 3–7.

21. A solution for CMP processing of a semiconductor substrate, the solution comprising:
an inhibitor, about 3–10% by weight of a first oxidizer and a second oxidizer including a minimal amount up to about 2% by weight of the second oxidizer selected from the group consisting of hydrogen peroxide and ammonium persulfate, to remove a copper material and a barrier material from the semiconductor substrate at about the same rate; the solution having a pH of about 3–7.

22. A solution for CMP processing of a semiconductor substrate, the solution comprising:
about 3–10% by weight of a first oxidizer and a second oxidizer including about 0.001–2% of the second oxidizer, and about 0.05–0.2% by weight of an inhibitor to remove a copper material and a barrier material from the semiconductor substrate at about the same rate;
wherein the first oxidizer is selected from the group consisting of potassium iodate, potassium permanganate, ferric nitrate, cerium (IV) compounds, bromates, chlorates, chromates, iodic acid, ammonium molybdate, nitric acid, potassium nitrate, amine compounds, and ammonia; and
the second oxidizer is selected from the group consisting of hydrogen peroxide and ammonium persulfate; and the solution has a pH of about 3–7.

23. A solution for CMP processing of a semiconductor substrate, the solution comprising:
effective amounts of about 3–10% by weight of an oxidizer and about 0.05–0.2% by weight of an inhibitor to remove a copper material and a barrier material comprising about 50% tungsten or greater from the semiconductor substrate at about the same rate, the solution having a pH of about 3–7.

24. The solution of claim 23, wherein the barrier material comprises tungsten nitride.

25. A solution for CMP processing of a semiconductor substrate, the solution comprising:
a mixture of about 3–10% by weight of an oxidizer, about 0.05–0.2% by weight of an inhibitor, and an abrasive; the oxidizer and inhibitor in amounts effective to remove a copper material and a tungsten barrier material from the semiconductor substrate at about the same rate, the solution having a pH of about 3 to about 7.

26. The solution of claim 25, wherein the abrasive is selected from the group consisting of alumina, titanium dioxide, silicon dioxide, and cerium dioxide.

27. The solution of claim 25, comprising about 3–5% by weight oxidizer, and about 0.05–10% by weight abrasive.

28. The solution of claim 25, further comprising a pH control agent.

29. A solution for CMP processing of a semiconductor substrate comprising a tungsten barrier material and a copper material disposed thereon, the solution comprising:
effective amounts of about 3–10% by weight of an oxidizer and about 0.05–0.2% by weight of an inhibitor to remove the tungsten barrier material at a slower rate than the copper material, the solution having a pH of about 3 to about 7.

30. The solution of claim 29, wherein the relative amounts are balanced so that a rate of removal of the tungsten barrier material by the slurry is about up to about ten times slower than a rate of removal of copper by the slurry.

31. The solution of claim 29, wherein the relative amounts are balanced so that a rate of removal of the tungsten barrier material by the slurry is about two to about four times less than a rate of removal of copper by the slurry.

32. The solution of claim 29, wherein, in the slurry the copper material and the tungsten barrier material each have an oxidation energy, the oxidation energy of the tungsten barrier material being about 0.25 volt more to about 0.2 volt less than the oxidation energy of the copper material.

33. The solution of claim 29, wherein the tungsten barrier material consists essentially of tungsten.

34. The solution of claim 29, wherein the tungsten barrier material comprises greater than about 50% tungsten.

35. The solution of claim 29, wherein the tungsten barrier material comprises tungsten nitride.

36. The solution of claim 29, having a pH of about 3 to about 5.

37. A solution for CMP processing of a semiconductor substrate comprising a tungsten barrier material and a copper material disposed thereon, the solution comprising:
a mixture of about 3–10% by weight of an oxidizer, about 0.05–0.2% by weight of an inhibitor, and an abrasive; the oxidizer and inhibitor in amounts effective to remove the tungsten barrier material at a slower rate than the copper material, the solution having a pH of about 3 to about 7.

* * * * *